(12) United States Patent
Fomenkov

(10) Patent No.: US 7,928,416 B2
(45) Date of Patent: Apr. 19, 2011

(54) LASER PRODUCED PLASMA EUV LIGHT SOURCE

(75) Inventor: Igor V. Fomenkov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 1013 days.

(21) Appl. No.: 11/644,153

(22) Filed: Dec. 22, 2006

(65) Prior Publication Data

US 2008/0149862 A1 Jun. 26, 2008

(51) Int. Cl.
 *H05G 2/00* (2006.01)
(52) U.S. Cl. .......... 250/504 R; 372/25; 372/55
(58) Field of Classification Search .......... 250/504 R
 See application file for complete search history.

(56) References Cited

U.S. PATENT DOCUMENTS

| | | | |
|---|---|---|---|
| 6,549,551 B2 | 4/2003 | Ness et al. | 372/38.07 |
| 6,567,450 B2 | 5/2003 | Myers et al. | 372/55 |
| 6,625,191 B2 | 9/2003 | Knowles et al. | 372/55 |
| 6,831,963 B2 | 12/2004 | Richardson | 378/119 |
| 6,855,943 B2 | 2/2005 | Shields | 250/504 |
| 6,862,339 B2 | 3/2005 | Richardson | 378/119 |
| 6,865,255 B2 | 3/2005 | Richardson | 378/119 |
| 6,933,515 B2 | 8/2005 | Hartlove et al. | 250/504 |
| 6,973,164 B2 | 12/2005 | Hartlove et al. | 378/119 |
| 6,998,785 B1 | 2/2006 | Silfast et al. | 315/111.71 |
| 7,067,832 B2 | 6/2006 | Mizoguchi et al. | 250/504 |
| 7,078,717 B2 | 7/2006 | Mizoguchi | 250/504 |
| 7,092,488 B2 | 8/2006 | Richardson | 378/119 |
| 7,164,144 B2 * | 1/2007 | Partlo et al. | 250/504 R |
| 7,239,686 B2 | 7/2007 | Berglund et al. | 378/119 |
| 7,482,609 B2 | 1/2009 | Ershov et al. | 250/504 |
| 7,529,281 B2 * | 5/2009 | Leonardo et al. | 372/22 |
| 2004/0170252 A1 | 9/2004 | Richardson | 378/119 |
| 2006/0140277 A1 | 6/2006 | Ju | 375/240.25 |
| 2006/0192153 A1 | 8/2006 | Bykanov et al. | 250/503.1 |
| 2006/0192154 A1 | 8/2006 | Algots et al. | 250/504 |
| 2006/0219957 A1 | 10/2006 | Ershov et al. | 250/504 |

(Continued)

FOREIGN PATENT DOCUMENTS

EP 1 492 394 12/2004
JP 2003-008124 1/2003

OTHER PUBLICATIONS

U.S. Appl. No. 11/580,414, filed Oct. 13, 2006, Bykanov et al.

(Continued)

*Primary Examiner* — Phillip A Johnston
(74) *Attorney, Agent, or Firm* — Matthew K. Hillman

(57) ABSTRACT

An EUV light source is disclosed which may comprise a plurality of targets, e.g., tin droplets, and a system generating pre-pulses and main-pulses with the pre-pulses for irradiating targets to produce expanded targets. The system may further comprise a continuously pumped laser device generating the main pulses with the main pulses for irradiating expanded targets to produce a burst of EUV light pulses. The system may also have a controller varying at least one pre-pulse parameter during the burst of EUV light pulses. In addition, the EUV light source may also include an instrument measuring an intensity of at least one EUV light pulse within a burst of EUV light pulses and providing a feedback signal to the controller to vary at least one pre-pulse parameter during the burst of EUV light pulses to produce a burst of EUV pulses having a pre-selected dose.

20 Claims, 6 Drawing Sheets

U.S. PATENT DOCUMENTS

| | | | |
|---|---|---|---|
| 2006/0249699 A1 | 11/2006 | Bowering et al. | 250/504 |
| 2006/0255298 A1 | 11/2006 | Bykanov et al. | 250/504 |
| 2006/0291627 A1 | 12/2006 | Richardson | 378/119 |
| 2007/0001130 A1 | 1/2007 | Bykanov et al. | 250/493.1 |
| 2007/0001131 A1 | 1/2007 | Ershov et al. | 250/503.1 |

OTHER PUBLICATIONS

U.S. Appl. No. 60/775,442, filed Feb. 21, 2006, Bowering et al.
European Search Report dated May 10, 2010 from European Patent Application No. 07862537.3, filed on Apr. 12, 2007 (10 pages).

* cited by examiner

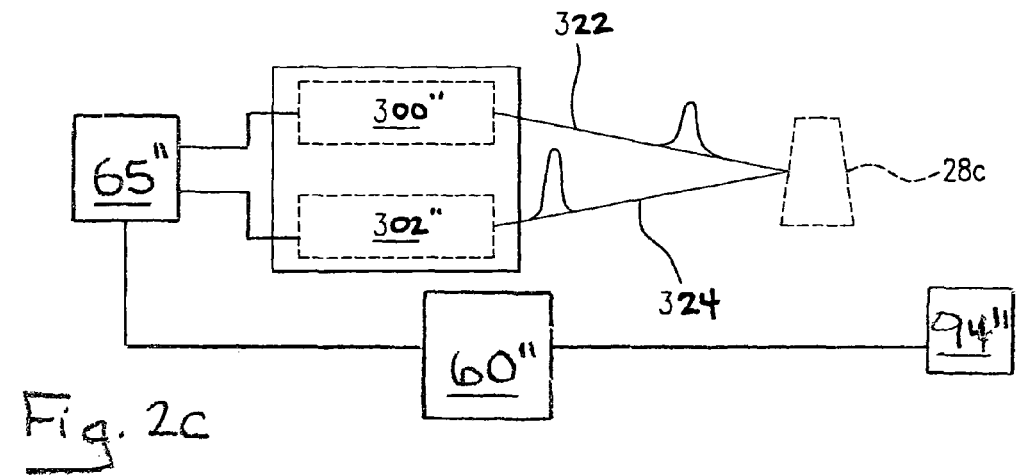
Fig. 2c
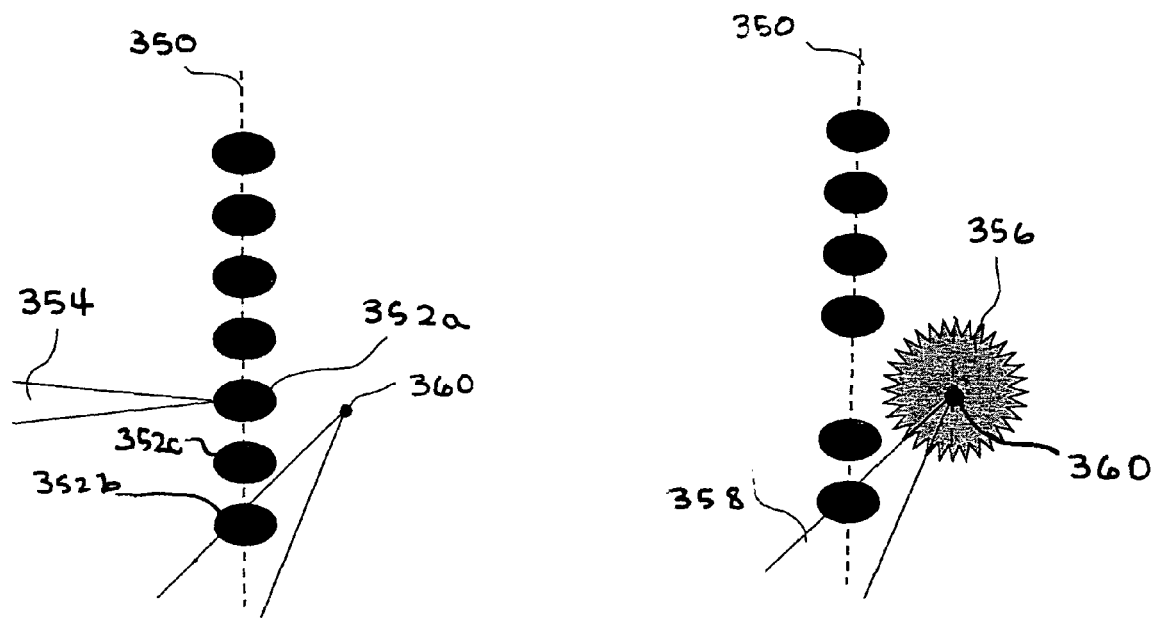
Fig. 3A
Fig. 3B

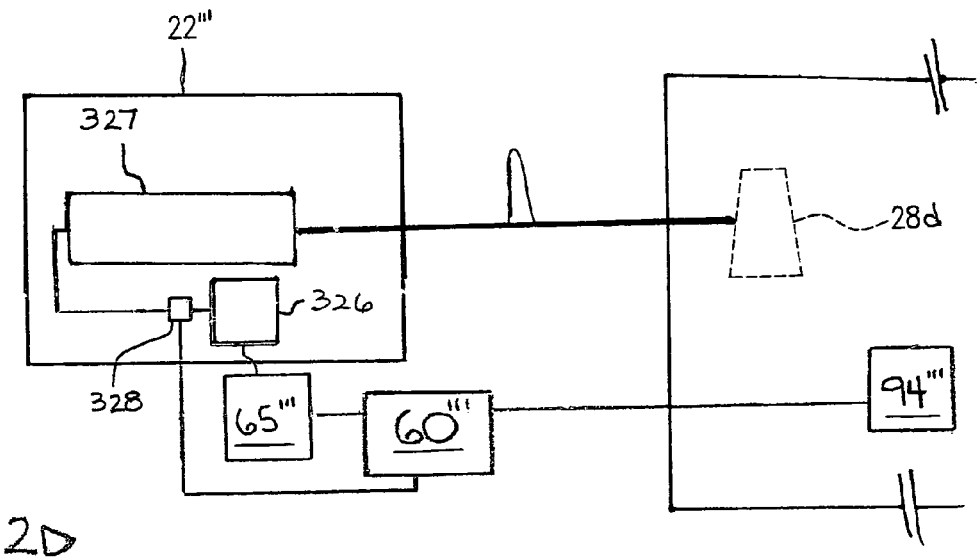
Fig. 2D
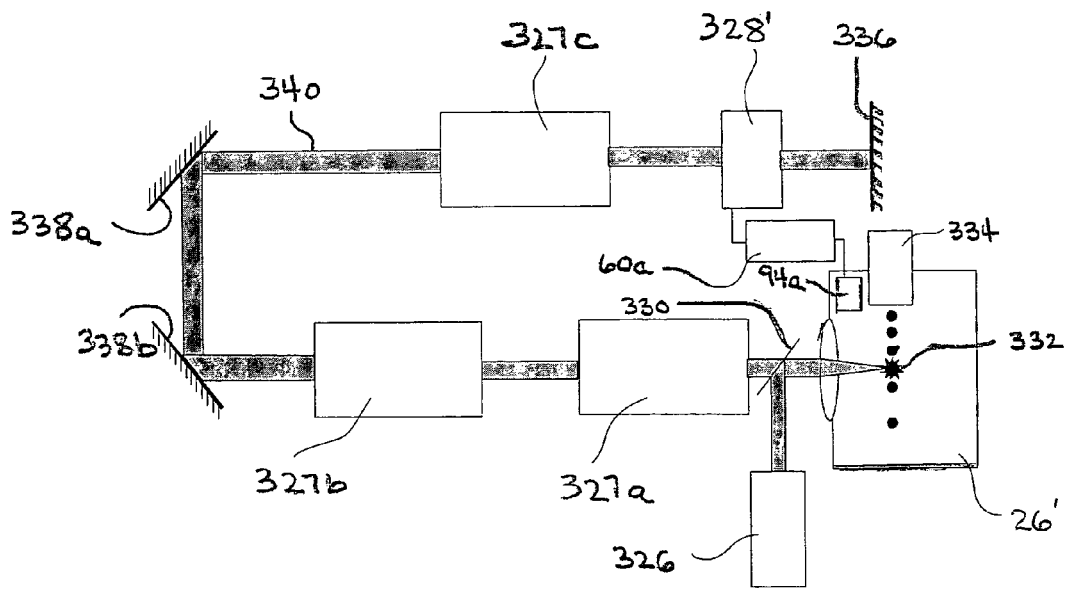
Fig 2E1

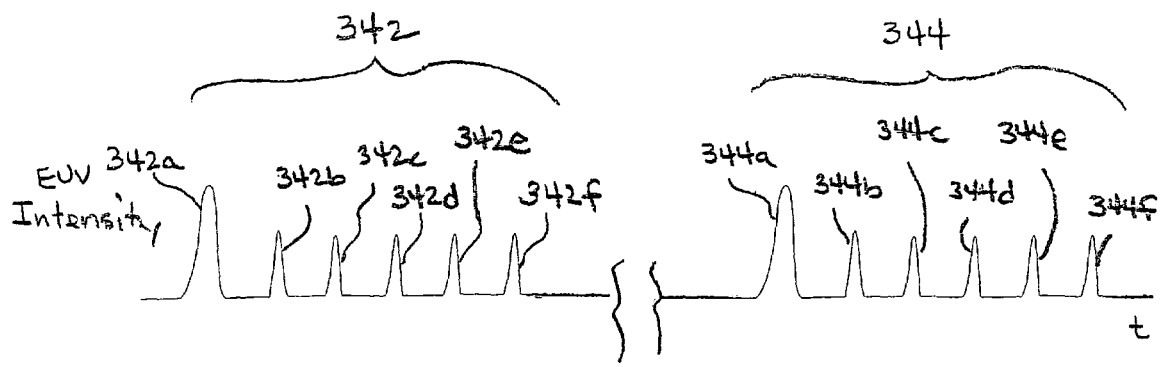
Fig 2F
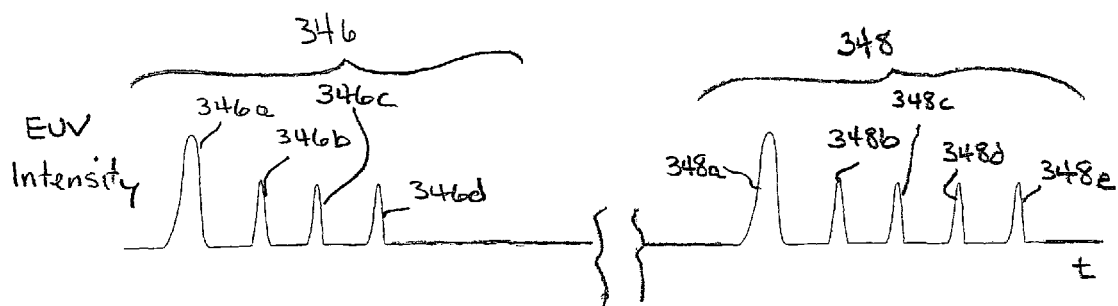
Fig 2G
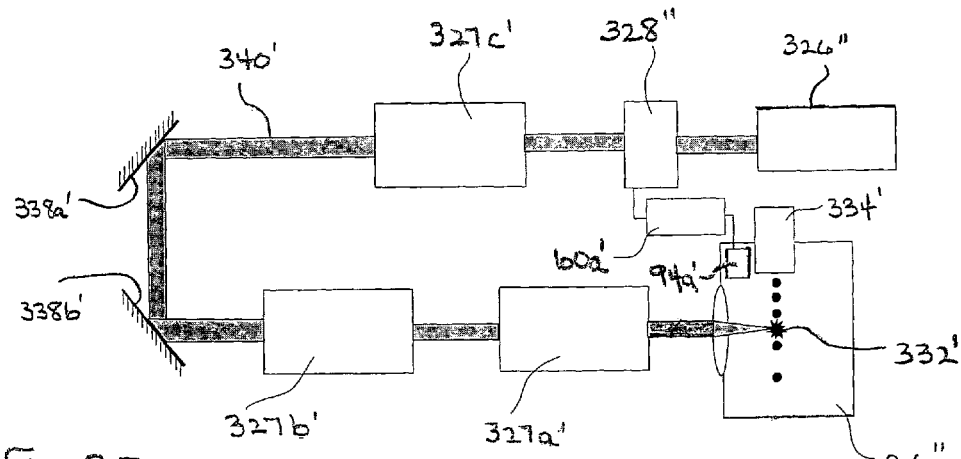
Fig 2E2

LASER PRODUCED PLASMA EUV LIGHT SOURCE

The present application is related to co-pending U.S. patent application Ser. No. 11/358,988 filed on Feb. 21, 2006, entitled LASER PRODUCED PLASMA EUV LIGHT SOURCE WITH PRE-PULSE, co-pending U.S. patent application Ser. No. 11/067,124 filed on Feb. 25, 2005, entitled METHOD AND APPARATUS FOR EUV PLASMA SOURCE TARGET DELIVERY, co-pending U.S. patent application Ser. No. 11/174,443 filed on Jun. 29, 2005, entitled LPP EUV PLASMA SOURCE MATERIAL TARGET DELIVERY SYSTEM, co-pending U.S. patent application Ser. No. 11/358,983 filed on Feb. 21, 2006, entitled TARGET MATERIAL DISPENSER FOR EUV LIGHT SOURCE, co-pending U.S. patent application Ser. No. 11/358,992 filed on Feb. 21, 2006, entitled LASER PRODUCED PLASMA EUV LIGHT SOURCE, co-pending U.S. provisional Patent Application Ser. No. 60/775,442 filed on Feb. 21, 2006, entitled EXTREME ULTRAVIOLET LIGHT SOURCE, co-pending U.S. patent application Ser. No. 11/174,299 filed on Jun. 29, 2005, and entitled, LPP EUV LIGHT SOURCE DRIVE LASER SYSTEM, co-pending U.S. patent application Ser. No. 11/406,216 filed on Apr. 17, 2006 entitled ALTERNATIVE FUELS FOR EUV LIGHT SOURCE, and co-pending U.S. patent application Ser. No. 11/580,414 filed on Oct. 13, 2006 entitled, DRIVE LASER DELIVERY SYSTEMS FOR EUV LIGHT SOURCE, the entire contents of each of which are hereby incorporated by reference herein.

FIELD

The present disclosure relates to extreme ultraviolet ("EUV") light sources which provide EUV light from a plasma that is created from a target material and collected and directed to a focus for utilization outside of the EUV light source chamber, e.g., for semiconductor integrated circuit manufacturing photolithography e.g., at wavelengths of around 50 nm and below.

BACKGROUND

Extreme ultraviolet light, e.g., electromagnetic radiation having wavelengths of around 50 nm or less (also sometimes referred to as soft x-rays), and including light at a wavelength of about 13.5 nm, can be used in photolithography processes to produce extremely small features in substrates, e.g., silicon wafers.

Methods to produce EUV light include, but are not necessarily limited to, converting a material into a plasma state that has an element, e.g., xenon, lithium or tin, with one or more emission line in the EUV range. In one such method, often termed laser produced plasma ("LPP") the required plasma can be produced by irradiating a target material, such as a droplet, stream or cluster of material having the required line-emitting element, with a laser beam.

Heretofore, LPP systems have been disclosed in which each droplet is irradiated by a separate laser pulse to form a plasma from each droplet. Also, systems have been disclosed in which each droplet is sequentially illuminated by more than one light pulses. In some cases, each droplet may be exposed to a so-called "pre-pulse" and a so-called "main pulse", however, it is to be appreciated that more than one pre-pulse may be used and more than one main pulse may be used and that the functions of the pre-pulse and main pulse may overlap to some extent. Typically, the pre-pulse(s) may function to expand the material and thereby increase the amount of material which interacts with the main pulse and the main-pulse may function to convert most or all of the material into a plasma and thereby produce an EUV light emission. However, it is to be appreciated that the functions of the pre-pulse and main pulse may overlap to some extent, e.g., the pre-pulse(s) may generate some plasma, etc. The increased material/pulse interaction may be due a larger cross-section of material exposed to the pulse, a greater penetration of the pulse into the material due to the material's decreased density, or both. Another benefit of pre-pulsing is that it may expand the target to the size of the focused pulse, allowing all of the pulse to participate. This may be especially beneficial if relatively small droplets are used as targets and the irradiating light cannot be focused to the size of the small droplet.

In addition to the above described techniques, U.S. Pat. No. 6,855,943 (hereinafter the '943 patent) which issued to Shields on Feb. 15, 2005 and is entitled "DROPLET TARGET DELIVERY METHOD FOR HIGH PULSE-RATE LASER-PLASMA EXTREME ULTRAVIOLET LIGHT SOURCE" discloses a technique in which only some of the droplets in a droplet stream, e.g., every third droplet, is irradiated to produce a pulsed EUV light output. As disclosed in the '943 patent, the nonparticipating droplets (so-called buffer droplets) advantageously shield the next participating droplet from the effects of the plasma generated at the irradiation site. Unfortunately, in some cases, these buffer droplets may reflect light back into the laser causing self-lasing, which among other things, can reduce the effectiveness of the laser's gain media in producing high energy pulses. This may be especially true for high gain (e.g., G=1000-10,000) infrared lasers, e.g., $CO_2$ lasers, which tend to self-lase rather easily.

A typically photolithography scanner exposes a portion of a moving wafer to a so-called "burst" of light pulses. In many cases, the pulse energy varies from pulse-to-pulse within the burst, and the accumulated energy of the burst, referred to generally as "dose", is typically prescribed and must be controlled within a relatively small range. In addition to dose, some lithography operations also prescribe limits on the pulse-to-pulse energy variation within a burst. This is sometimes referred to as pulse-to-pulse energy stability. The lasers that are used in deep ultraviolet photolithography (DUV), e.g., excimer lasers at a wavelength of, e.g., 100-300 nm, typically have the ability to substantially vary pulse energy within a burst of pulses, and in some cases, on a pulse-to-pulse basis. This can be achieved, for example, by altering the discharge voltage used to create each pulse. This flexibility, however, is not available for all types of lasers. In some laser architectures, a continuously pumped active media may be used to generate laser pulses. For example, pulses may be generated in a continuously pumped oscillator using, for example, Q-switch or cavity dump mode, and then amplified by one or more continuously pumped power amplifiers. As used herein, the term continuously pumped laser devices (CW laser devices) refers to a laser device having a continuously pumped active media, e.g., continuously pumped oscillator and/or continuously pumped amplifier. Unlike the pulse—pumped laser devices described above, e.g., excimer discharge laser devices, the CW laser devices do not have the ability to quickly vary their discharge voltage, and as a consequence, are generally incapable of substantially varying their output pulse energy within a burst of pulses by altering their discharge voltage.

As indicated above, one technique to produce EUV light involves irradiating a target material droplet with one or more pre-pulse(s) followed by a main pulse. In this regard, $CO_2$ lasers, and in particular, continuously pumped $CO_2$ laser devices may present certain advantages as a drive laser producing "main" pulses in an LPP process. This may be especially true for certain targets, e.g., tin. For example, one advantage may include the ability to produce a relatively high conversion efficiency e.g., the ratio of output EUV in-band power to drive laser input power.

Along these lines, U.S. Pat. No. 6,973,164 which issued to Hartlove et al. on Dec. 6, 2005 and is entitled "LASER-PRODUCED PLASMA EUV LIGHT SOURCE WITH PRE-PULSE ENHANCEMENT" discloses that a variation in time delay between pre-pulse and main pulse in a Nd:YAG with Xenon targets LPP system results in a variation of output EUV intensity for time delays shorter than 160 ns.

With the above in mind, Applicants disclose a laser produced plasma EUV light source, and corresponding methods of use.

SUMMARY

In a first aspect of an embodiment of the present application, an EUV light source may comprise a plurality of targets, e.g., tin droplets, and a system generating pre-pulses and main-pulses with the pre-pulses for irradiating targets to produce expanded targets. The system may further comprise a continuously pumped laser device generating the main pulses with the main pulses for irradiating expanded targets to produce a burst of EUV light pulses. The system may also have a controller varying at least one pre-pulse parameter during the burst of EUV light pulses. In addition, the EUV light source may also include an instrument measuring an intensity of at least a portion of one EUV light pulse within a burst of EUV light pulses and providing a feedback signal to the controller to vary at least one pre-pulse parameter during the burst of EUV light pulses.

For this aspect, the pre-pulse parameter may be a delay time between a pre-pulse and the corresponding main pulse and/or the pre-pulse parameter may be the pulse energy of the pre-pulse. In one embodiment of this aspect, the continuously pumped laser device may comprise a $CO_2$ laser device and in a particular embodiment the pre-pulses may pass through the continuously pumped laser device.

In another aspect, a method for generating EUV light may comprise the steps/acts of irradiating at least one target material droplet(s) with an initial light pulse to create irradiated target material, exposing irradiated target material to a subsequent light pulse to generate EUV light, measuring an intensity of the EUV light generated, using the measurement to calculate an energy magnitude for a subsequent light pulse, and thereafter irradiating a target material droplet with a light pulse having the calculated energy magnitude. In one implementation, the subsequent light pulse may be generated using a continuously pumped laser device and in a particular implementation, the continuously pumped laser device may comprise a $CO_2$ laser device and the target material may comprise tin.

For another aspect of an embodiment, an EUV light source may comprise a plurality of target material droplets traveling along a path, e.g., a substantially linear path, and a system generating an initial pulse and a subsequent pulse. The initial pulse is provided for irradiating a droplet on the path to generate irradiated target material exiting the path, and the subsequent pulse is focused to a location for interaction with the irradiated target material. For this aspect, the location is distanced from the path and the subsequent pulse is provided for exposing the irradiated target material to generate EUV light.

In one implementation of this aspect, only every other droplet traveling along the path is irradiated by a respective pre-pulse. In some embodiments, the initial pulse and the subsequent pulse may travel along a common beam path. In particular, the first and subsequent pulse may be focused using a common optic and the initial pulse and the subsequent pulse may have differing beam divergences prior to focusing. The light source may further comprise one or more saturable absorbers positioned to absorb photons reflected from the target material. Alternatively, or in addition thereto, the system may comprise an amplifier amplifying the subsequent pulse and the light source may further comprise an optical isolator positioned along a beam path between the target material and amplifier. In a particular embodiment, the light beam within the amplifier may have a primary polarization direction and the optical isolator may comprise a phase retarding optic, e.g., phase retarding mirror and a polarizer.

In another aspect of an embodiment of the present application, an EUV light source may comprise a plurality of targets and a system generating laser pulses, the laser pulses for irradiating targets to produce a burst of EUV light pulses. For this aspect, the EUV light source may further comprise an instrument measuring an intensity of at least a portion of one EUV light pulse within a burst of EUV light pulses and providing a feedback signal indicative thereof, and a shutter responsive to the feedback signal to trim a laser pulse, the trimmed laser pulse generating an EUV light pulse during the burst of EUV light pulses. For this aspect, the portion of the EUV pulse that is measured may be a temporal portion, a spatial portion, or a temporal and spatial portion.

In one implementation of this aspect, the portion of the EUV pulse that is measured may be a temporal portion and the EUV pulse generating the measured intensity may be produced by the trimmed laser pulse. For example, the system may comprise an optical oscillator outputting laser pulses. Each output laser pulse may have a pulse duration, t, and the travel time, T, for light traversing an optical path extending from the optical oscillator output through the target and to an intensity measurement site may be less than the pulse duration exiting the oscillator, T<t. In a particular embodiment, each output laser pulse may have a pulse duration, $t>T+T_s$, where $T_s$ may define a system time including, for example, a detector response time, a processor response time, a driver response time, a switch response time and a signal propagation time. In one arrangement, the detector, switch and processor may be positioned closely together to minimize $T_s$. Furthermore, the system may comprise at least one optical amplifier receiving laser light from the optical oscillator along an optical path and the shutter may be positioned on the optical path between the optical amplifier and the optical oscillator.

In another implementation of this aspect, the EUV pulse measured to produce the feedback signal may be generated by a corresponding laser pulse and the feedback signal produced therefrom may be used to trim a subsequent laser pulse. In either of these implementations, the shutter may comprise an electro-optic switch. For example, the system generating laser pulses may comprise an optical oscillator defining a primary polarization direction for light exiting the oscillator and the shutter may comprise an electro-optic switch having an electro-optic cell, e.g. Pockels or Kerr cell, and a polarizer.

In one implementation, the system generating laser pulses may comprise an optical oscillator and at least one optical amplifier and in a first particular implementation the optical oscillator may be a cavity dumped oscillator and in a second particular implementation the optical oscillator may be a transverse electrical-discharge oscillator having a pulsed electrical-discharge power source. For any of these implementations, the amplifier may comprise a continuously pumped laser device.

One implementation of the EUV light source employs a chamber in which the laser pulses irradiate the targets. For this implementation, the intensity measuring instrument may be positioned inside the chamber, outside the chamber or in some cases, multiple instruments may be employed, e.g. one inside and one outside the chamber. For example, an intensity measuring instrument may be positioned in a lithography scanner that is coupled to the chamber and/or an intensity measuring instrument may be positioned at a location optically downstream of a lithography scanner that is coupled to the chamber.

In another aspect of an embodiment of the present application, an EUV light source may comprise a plurality of targets and a system generating laser pulses which comprises a transverse, electrical-discharge oscillator having a pulsed electrical-discharge power source. The laser pulses may be provided for irradiating targets to produce a burst of EUV light pulses and the EUV light source may further comprise an instrument measuring an intensity of at least a portion of one EUV light pulse within a burst of EUV light pulses, with the instrument providing a feedback signal indicative thereof. A controller responsive to the feedback signal may be provided to establish a discharge voltage for a subsequent laser pulse, the subsequent laser pulse generating an EUV light pulse during the burst of EUV light pulses. In one particular implementation, the transverse electrical-discharge oscillator may comprise a $CO_2$ oscillator.

In still another aspect of an embodiment of the present application, an EUV light source may comprise a target material and a system having at least one optic establishing a beam path with the target material. For this aspect, the system may provide an initial light pulse for an initial photon interaction with the target material, the initial interaction generating a reflected pulse passing back and forth along the beam path between the optic and target material and producing a plurality of subsequent photon interactions with the target material. Each of the subsequent interactions may produce an EUV emission and the system may have an optical gain medium positioned along the beam path. The EUV light source may further comprise an instrument measuring an EUV emission intensity and providing a feedback signal indicative thereof; and a shutter responsive to the feedback signal to selectively limit the number of subsequent photon interactions generated by the initial light pulse.

In a particular embodiment of this aspect, the system may comprise an optical oscillator coupled with the beam path to provide the initial light pulse. In one implementation the instrument may measure an EUV emission intensity from a subsequent interaction corresponding to an initial pulse and generate a feedback signal for limiting the number of subsequent photon interactions generated by the same initial light pulse. In another implementation the instrument may measure an EUV emission intensity from a subsequent interaction corresponding to an initial pulse and generate a feedback signal for limiting the number of subsequent photon interactions generated by a different, e.g. later, initial light pulse.

BRIEF DESCRIPTION OF THE DRAWINGS

FIG. 2C shows another embodiment in which the pre-pulses and main pulses may travel along different beam paths to reach the target volume;

FIG. 2D shows another arrangement which may be employed to control EUV output dose and/or pulse to pulse stability;

FIG. 2E1 shows another arrangement which may be employed to control EUV output dose and/or pulse to pulse stability;

FIG. 2E2 shows another arrangement which may be employed to control EUV output dose and/or pulse to pulse stability;

FIG. 2F shows a plot of EUV output intensity versus time having a first EUV pulse corresponding to an initial LPP interaction and subsequent EUV pulses corresponding to reflected LPP pulses;

FIG. 2G shows a plot of EUV output intensity versus time as in FIG. 2F but after a shutter has eliminated some of the "subsequent EUV pulses" to control dose and/or pulse to pulse stability;

FIG. 3A shows a schematic view of a plurality of target material droplets that are traveling along a common path immediately prior to irradiation by a pre-pulse;

FIG. 3B shows a schematic view of a plurality of target material droplets that are traveling along a common path immediately following irradiation of a droplet by a pre-pulse;

DETAILED DESCRIPTION

Figure 1:
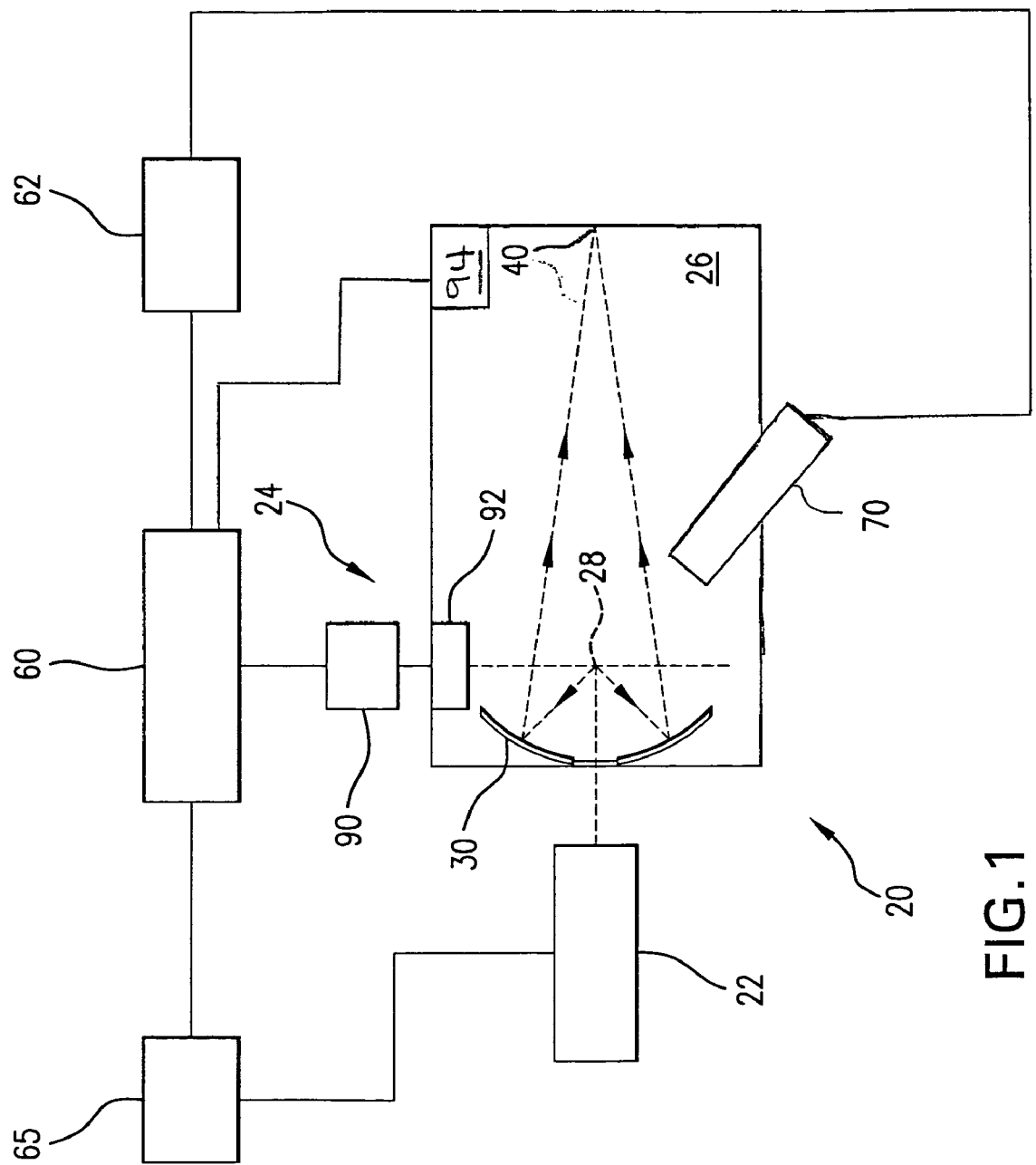
FIG. 1 shows a schematic view of an overall broad conception for a laser-produced plasma EUV light source according to an aspect of an embodiment.

With initial reference to, FIG. 1 there is shown a schematic view of an exemplary EUV light source, e.g., a laser produced plasma EUV light source 20 according to one aspect of an embodiment. As shown in FIG. 1, and described in further detail below, the LPP light source 20 may include a system 22 for generating light pulses and delivering the light pulses into a chamber 26. As detailed below, the light pulses may travel along one or more beam paths from the system 22 and into the chamber 26 to illuminate one or more targets at an irradiation region 28.

As further shown in FIG. 1, the EUV light source 20 may also include a target material delivery system 24, e.g., delivering droplets of a target material into the interior of a chamber 26 to the irradiation region 28 where the droplets will interact with one or more light pulses, e.g., one or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets or any other form which delivers the EUV emitting element to the target volume in discrete amounts. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, $SnBr_4$) at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV source is provided in co-pending U.S. patent application Ser. No. 11/406,216 filed on Apr. 17, 2006 entitled ALTERNATIVE FUELS FOR EUV LIGHT SOURCE, the contents of which has been previously incorporated by reference herein.

Continuing with FIG. 1, the EUV light source 20 may also include a collector 30, e.g., a reflector, e.g., in the form of a truncated ellipsoid, e.g., a graded multi-layer mirror having alternating layers of Molybdenum and Silicon, with an aperture to allow the light pulses generated by the system 22 to pass through and reach the irradiation region 28. The collector 30 may be, e.g., an ellipsoidal mirror that has a first focus within or near the irradiation region 28 and a second focus at a so-called intermediate point 40 (also called the intermediate focus 40) where the EUV light may be output from the EUV light source 20 and input to a device utilizing EUV light, e.g., an integrated circuit lithography tool (not shown).

The EUV light source 20 may also include an EUV controller 60, which may also include a firing control system 65 for triggering one or more lamps and/or laser devices in the system 22 to thereby generate light pulses for delivery into the chamber 26. The EUV light source 20 may also include a droplet position detection system which may include one or more droplet imagers 70 that provide an output indicative of the position of one or more droplets, e.g., relative to the irradiation region 28. The imager(s) 70 may provide this output to a droplet position detection feedback system 62, which can, e.g., compute a droplet position and trajectory, from which a droplet error can be computed, e.g., on a droplet by droplet basis or on average. The droplet error may then be provided as an input to the controller 60, which can, for example, provide a position, direction and/or timing correction signal to the system 22 to control a source timing circuit and/or to control a beam position and shaping system, e.g., to change the location and/or focal power of the light pulses being delivered to the irradiation region 28 in the chamber 26.

As further shown in FIG. 1, the EUV light source 20 may include a droplet delivery control system 90, operable in response to a signal (which in some implementations may include the droplet error described above, or some quantity derived therefrom) from the controller 60, to e.g., modify the release point of the target material from a droplet delivery mechanism 92 to correct for errors in the droplets arriving at the desired irradiation region 28.

For the EUV light source 20, the droplet delivery mechanism 92 may include, for example, a droplet dispenser creating either 1) one or more streams of droplets exiting the dispenser or 2) one or more continuous streams which exit the dispenser and subsequently break into droplets due to surface tension. In either case, droplets may be generated and delivered to the irradiation region 28 such that one or more droplets may simultaneously reside in the irradiation region 28 allowing one or more droplets to be simultaneously irradiated by an initial pulse, e.g., pre-pulse to form an expanded target suitable for exposure to one or more subsequent laser pulse(s), e.g., main pulse(s), to generate an EUV emission. In one embodiment, a multi-orifice dispenser may be used to create a "showerhead-type" effect. In general, for the EUV light source 20, the droplet dispenser may be modulating or non-modulating and may include one or several orifice(s) through which target material is passed to create one or more droplet streams. More details regarding the dispensers described above and their relative advantages may be found in co-pending U.S. patent application Ser. No. 11/358,988 filed on Feb. 21, 2006, entitled LASER PRODUCED PLASMA EUV LIGHT SOURCE WITH PRE-PULSE, co-pending U.S. patent application Ser. No. 11/067,124 filed on Feb. 25, 2005, entitled METHOD AND APPARATUS FOR EUV PLASMA SOURCE TARGET DELIVERY, and co-pending U.S. patent application Ser. No. 11/174,443 filed on Jun. 29, 2005, entitled LPP EUV PLASMA SOURCE MATERIAL TARGET DELIVERY SYSTEM, the contents of each of which were previously incorporated by reference.

FIG. 1 also shows, schematically, that the EUV light source 20 may include one or more EUV metrology instruments 94 for measuring various properties of the EUV light generated by the source 20. These properties may include, for example, intensity (e.g., total intensity or intensity within a particular spectral band), spectral bandwidth, polarization, etc. For the EUV light source 20, the instrument(s) 94 may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

Figure 2A:
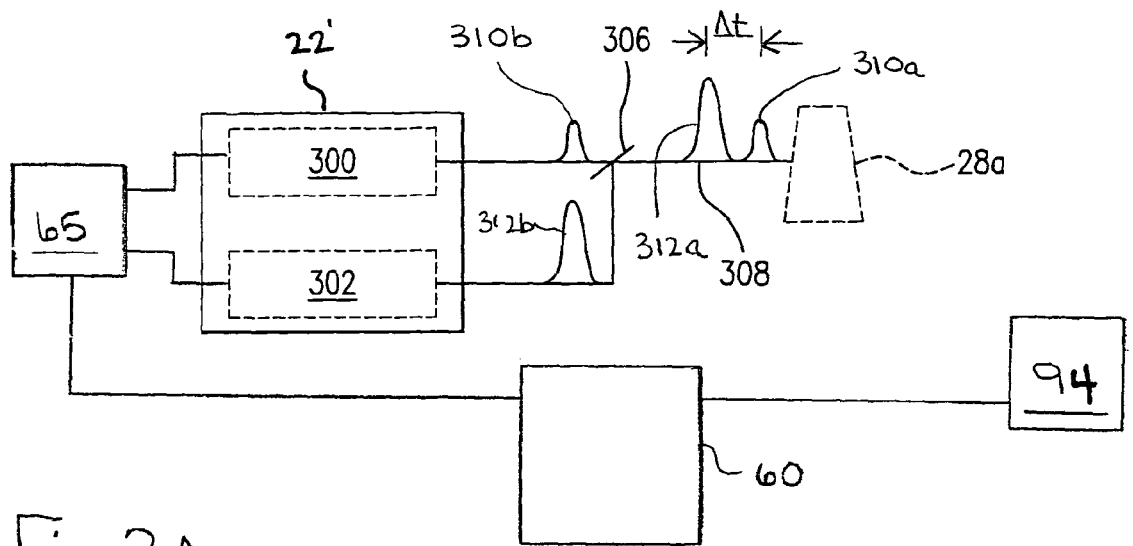
FIG. 2A shows a schematic view of portions of an EUV light source illustrating the control EUV output intensity by varying one or more pre-pulse parameters.

FIG. 2A shows in more detail an aspect of an embodiment in which EUV output intensity may be controlled within a burst of pulses, and in some cases on a pulse-to-pulse basis, to provide a predetermined energy dose, e.g., energy dose within a predetermined range. As shown there, the system 22' may include two separate devices 300, 302 that are used to generate the pre-pulse(s) and main pulse(s), respectively. FIG. 2A also shows that a beam combiner 306 may be employed to combine pulses from the devices 300, 302 along a common beam path 308. Device 300 may be a lamp, e.g., producing incoherent light, or a laser and typically is selected to produce output pulses having controllable energy within a burst, and in some cases on a pulse-to-pulse basis. Suitable lasers for use as the device 300 may include pulsed gas discharge lasers such as excimer, $CO_2$, etc, pulsed solid state lasers, e.g., disk shaped Nd:YAG, etc.

Light device 302 is typically a laser and may be a different type of laser than used for device 300. Suitable lasers for use as the device 302 may include a pulsed laser device, e.g., a pulsed gas discharge $CO_2$ laser device producing radiation at 9.3 μm or 10.6 μm, e.g., with DC or RF excitation, operating at relatively high power, e.g., 10 kW and high pulse repetition rate, e.g., 24 kHz or more. In one particular implementation, a continuously pumped $CO_2$ laser device may be used for the device 302. For example, a suitable $CO_2$ laser device having an oscillator and three amplifiers (O-PA1-PA2-PA3 configuration) is disclosed in co-pending U.S. patent application Ser. No. 11/174,299 filed on Jun. 29, 2005, and entitled, LPP EUV LIGHT SOURCE DRIVE LASER SYSTEM, the entire contents of which have been previously incorporated by reference herein. Depending on the application, other types of lasers may also be suitable, e.g., an excimer or molecular fluorine laser operating at high power and high pulse repetition rate. Examples include, a solid state laser, e.g., having a fiber or disk shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

As further illustrated by FIG. 2A, the device 300 generates a train of pre-pulses 310a,b that are delivered to an irradiation region 28a. At the target volume, each pre-pulse may irradiate at least one droplet(s) to produce an expanded target. Also, device 302 generates a train of main pulses 312a,b with each main pulse for irradiating a respective expanded target at or near the irradiation region 28a to produce an EUV light output which can then be measured by the instrument 94 (shown in FIG. 1).

FIG. 2A also illustrates an example of a system architecture for varying a pre-pulse parameter during the train of pre-pulses in response to a signal from the measurement instrument 94, e.g., intensity detector. As shown in FIG. 2A, the controller 60 may receive a signal, e.g., a feedback signal, e.g., a signal indicative of EUV output intensity, from the instrument 94 and in turn, communicate with firing control system 65 to independently trigger one or both of the sources 300, 302 and/or control the discharge voltage of the device 300. Although the controller 60 and firing control system 65 are shown as discrete elements, it is to be appreciated that the controller 60 and firing control system 65 may be integrated into a common unit and/or may share one or more processors, memory boards, etc.

With the above-described arrangement, one or more pre-pulse parameters may be varied such that the EUV output intensity of a subsequent, e.g., next, EUV output pulse may be controlled. For example, the pre-pulse parameter may be a delay time, $\Delta t$, between a pre-pulse 310a and a corresponding main pulse 312a. This may be accomplished by controlling the triggering times for the devices 300, 302. Alternatively, or in addition thereto, the pulse energy of the pre-pulse may be varied to control the EUV output intensity. In one implementation, a processor in the controller 60 may have access to memory holding a dataset, e.g. electronic lookup table, (which may include empirically derived and/or calculated data) having a tabulated correspondence between one or more pre-pulse parameters and EUV output intensity. Thus, in one implementation, an algorithm may be processed to track a running average of the EUV output intensity during a burst. Based on the running average or some similar parameter, the algorithm may further be processed to calculate a desired EUV output intensity for a subsequent, e.g., next, EUV output pulse, selected to obtain a desired dose. The algorithm may then query the dataset to retrieve one or more pre-pulse parameters corresponding to the desired EUV output intensity and initiate the transmission of a signal indicative of the pre-pulse parameter(s) to the firing control system 65. The firing control system 65 may then implement the pre-pulse parameter(s) by controlling the trigger times and/or discharge voltages for the device 300 such that a subsequent, e.g., next, pre-pulse/main pulse droplet irradiation is performed with the selected pre-pulse parameter.

Figure 2B:
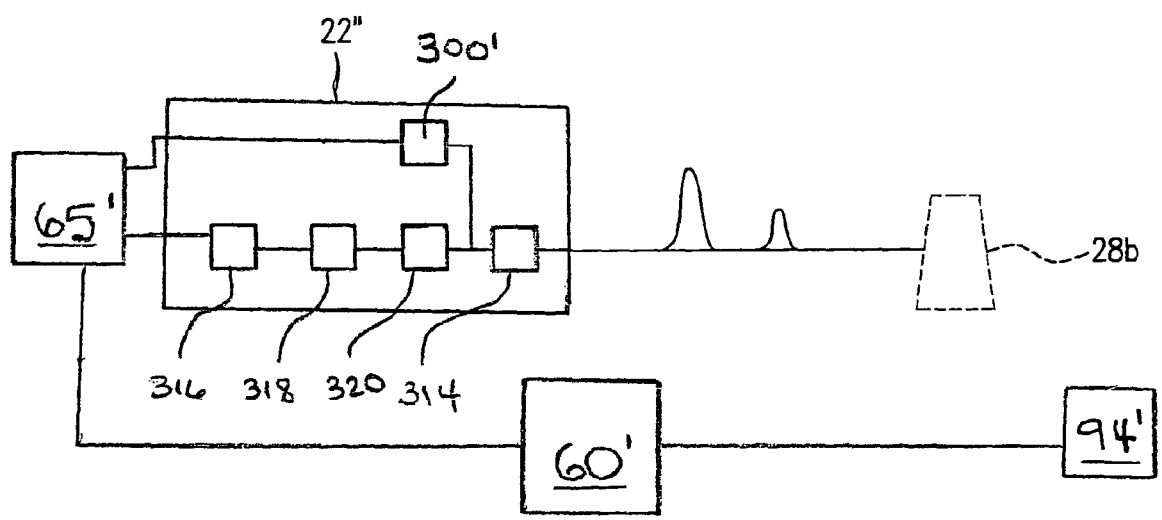
FIG. 2B shows another embodiment in which the source producing a train of pre-pulses and the source producing a train of main pulses may share a common pulse amplifier.

FIG. 2B shows another embodiment having a system 22" in which the source producing a train of pre-pulses and the source producing a train of main pulses may share a common pulse amplifier 314. For this setup, the main pulses may be generated using a four chamber O-PA1-PA2-PA3 architecture as shown and designated 316 (oscillator), 318 (PA1), 320 (PA2), 314 (PA3). Pulses generated by the laser device 300' may pass through the PA 314 for amplification, prior to delivery to the irradiation region 28b, as shown. Although three amplifiers are shown in FIG. 2B, it is to be appreciated that more than three and as few as one amplifier may be specified for the system 22". For the arrangement shown in FIG. 2B, the controller 60' may receive a signal, e.g., a feedback signal, e.g., a signal indicative of EUV output intensity, from the measuring instrument 94' and in turn, communicate with firing control system 65' to independently trigger the device 300' and/or the oscillator 316 and/or control the discharge voltage of the device 300'. In this manner, a pre-pulse parameter, e.g., a delay time between a pre-pulse and a corresponding main pulse and/or the pulse energy of the pre-pulse, may be varied to control the EUV output intensity, e.g., on a pulse-to-pulse basis, and thereby control EUV output dose and/or pulse stability.

FIG. 2C illustrates that pulses from the light sources 300", 302" may travel along different beam paths 322, 324 to reach the irradiation region 28c. For the arrangement shown in FIG. 2C, controller 60" may receive a signal, e.g., a feedback signal, e.g., a signal indicative of EUV output intensity, from the measurement instrument 94" and in turn, communicate with firing control system 65" to independently trigger one or more of the devices 300", 302" and/or control the discharge voltage of the device 300". In this manner, a pre-pulse parameter, e.g., a delay time between a pre-pulse and a corresponding main pulse and/or the pulse energy of the pre-pulse, may be varied to control the EUV output intensity, e.g., on a pulse-to-pulse basis, and thereby control EUV output dose and/or pulse stability.

FIG. 2D shows another arrangement which may be employed to control EUV output dose and/or pulse stability. As shown there, the system 22''' may include a device 326, e.g. oscillator generating laser pulses, e.g., main pulses, with each pulse having a pulse duration, and an amplifier 327 having one or more amplifying chambers. Note: for some embodiments the device 326 may also provide pre-pulses or a separate device (not shown) may be included to provide pre-pulses. As shown, the system 22''' may also include a shutter 328 operable to alter, e.g., trim, a pulse such that only a temporal portion of the pulse is delivered to the irradiation region 28d to illuminate the target material.

FIG. 2D also illustrates that controller 60''' may receive a signal, e.g., a feedback signal, e.g., a signal indicative of EUV output intensity, from the measuring instrument 94''' and in turn, communicate with the shutter 328. Also shown, the controller 60''' may communicate with the firing control system 65''' to trigger and/or control the discharge voltage of the device 326. For the EUV light source shown in FIG. 2D, the shutter 328 (shown schematically) may include an electro-optic switch, e.g. having a time response in the nanosecond range, e.g., Pockel's or Kerr cell, and a polarizer. For example, the device 326, e.g., $CO_2$ laser device, may employ polarizer(s) and/or Brewster's windows such that light exiting the device 326 has a primary polarization direction. With this arrangement, the shutter may include an electro-optic switch and a polarizer having a transmission axis aligned orthogonal to the primary polarization direction defined by the device 326. Thus, when the switch is energized, light is able to pass from the device 326 to the irradiation region 28d. On the other hand, when the switch is de-energized, light exiting the device 326 is rotated and is absorbed and/or reflected (away from the beam path leading to the irradiation region 28d) by the polarizer.

In one setup, the device 326 may be configured to produce and output pulses having a pulse duration, t, that is longer than the travel time, T, for light traversing the optical path extending from the output of the device 326, through the target, and to the intensity measurement site. With this arrangement, EUV light generated by the leading portion of the laser pulse may be measured and the measurement used to trim the trailing portion of the same laser pulse. In some cases, a pulse stretcher (not shown) may be used to provide pulses having t>T. In a particular embodiment, each output laser pulse may have a pulse duration, t>T+$T_s$, where $T_s$ may define a system time including, for example, a detector response time, a processor response time, a driver response time, a switch response time and a signal propagation time. In one arrangement, the measuring instrument 94''', shutter 328 and controller 60''' may be positioned closely together to minimize $T_s$. It is to be appreciated that this same technique (i.e. measuring EUV produced by a leading portion of a laser pulse and trimming the trailing portion of the same laser pulse) may also be used on pulses whose pulse duration, t, is shorter than the travel time, T, for light traversing the optical path extending from the output of the device 326, through the target, and to the intensity measurement site. For example, this functionality may be obtained by moving the shutter 328 to a position on the optical path that is relatively close to the irradiation site. However, the arrangement shown in FIG. 2D in which the shutter 328 is positioned upstream of the amplifier may be beneficial in some applications due to the relatively low laser light intensity at the shutter 328.

The arrangement shown in FIG. 2D may also be configured to control EUV output dose and/or pulse stability by measuring an EUV light pulse parameter, e.g., intensity, for EUV light produced by a first laser pulse and using the measurement to thereafter trim a subsequent laser pulse. For this arrangement, the device 326 may be, but is not necessarily limited to, a cavity dumped oscillator or a transverse electric-discharge oscillator.

FIG. 2E1 shows an EUV light source having an arrangement which may be employed to control EUV output dose and/or pulse to pulse stability. As shown there, the light source may include a system having a device 326', e.g., oscillator generating laser pulses, e.g., main and/or pre-pulses, e.g., a $CO_2$ master oscillator, and an amplifier having one or more amplifying chambers 327a, 327b, 327c. Note: for some embodiments, a separate device (not shown) may be included to provide pre-pulses. For the EUV light source, the device 326' may provide an initial light pulse which is directed by beam combiner 330 into chamber 26' where the light pulse produces an initial photon interaction with the target material 332, e.g. droplet produced by a droplet generator 334.

FIG. 2E1 further shows that the system may include on optic 336 and a pair of turning mirrors 338a,b which together with the target material 332 establish a beam path 340. For the system shown, the optic 336 may be, for example, a reflecting mirror or corner reflector. The EUV light source may also include a shutter 328' switchable between a first state allowing light to travel between the amplifier 327c and optic 336 and a second state preventing light travel between the amplifier 327c and optic 336. For the EUV light source, the shutter 328' may include an electro-optic switch, e.g., having a time response in the nanosecond range, e.g., Pockel's or Kerr cell, and a polarizer. For example, one or more of the amplifiers 327a-c and/or device 326', may employ polarizer(s) and/or Brewster's windows such that light traveling between turning mirror 338a and shutter 328' has a primary polarization direction. With this arrangement, the shutter 328' may include an electro-optic switch and a polarizer having a transmission axis aligned orthogonal to the primary polarization direction defined by the device 326'. Thus, when the switch is energized, light is able to pass between the amplifier 327c and optic 336. On the other hand, when the switch is de-energized, the light will have a polarization orthogonal to the polarizer transmission axis and will be reflected away from the beam path leading to the target material 332 by the polarizer. Alternatively, the shutter 328' may include an acousto-optic switch, e.g., an acousto optic cell with RF amplitude control, that is switchable between a first state allowing light to travel between the amplifier 327c and optic 336 and a second state preventing light travel between the amplifier 327c and optic 336.

FIG. 2E1 further shows that the EUV light source may also include a controller 60a having a processor and one or more drivers. As shown, the controller 60a may receive a signal, e.g., a feedback signal, e.g., a signal indicative of an EUV output intensity, from a measuring instrument 94a and in turn, communicate with the shutter 328'.

FIG. 2E2 shows an EUV light source arrangement (having one or more components in common with the arrangement shown in FIG. 2E1) which may be employed to control EUV output dose and/or pulse to pulse stability. As shown, an EUV light source may include a device 326'', e.g., oscillator generating laser pulses (main pulses and/or pre-pulses as described above) an amplifier having one or more amplifying chambers 327a', 327b', 327c' (as described above) a pair of turning mirrors 338a', b' which together with the target material 332' and at least one optic in the device 326' (e.g. output coupler and/or rear reflector) establish a beam path 340'. For the EUV light source, the device 326'' may provide an initial light pulse which is directed through the amplifying chambers 327a', 327b', 327c' (which may or may not amplify the initial pulse) into chamber 26'' where the light pulse produces an initial photon interaction with the target material 332', e.g., droplet produced by a droplet generator 334'.

FIG. 2E2 further shows that the EUV light source may include a shutter 328'' (e.g., electro-optic or acouto-optic as described above) switchable between a first state allowing light to travel between the amplifier 327c' and device 326' and a second state preventing light travel between the amplifier 327c' and device 326'. FIG. 2E2 also shows that the EUV light source may include a controller 60a' having a processor and one or more drivers. As shown, the system controller 60a' may receive a signal, e.g., a feedback signal, e.g., a signal indicative of an EUV output intensity, from a measuring instrument 94a' and in turn, communicate with the shutter 328''. In the operation of the EUV light source shown in FIG. 2E2, the device 326'' may provide an initial light pulse, e.g., laser pulse, which is directed along beam path 340' into chamber 26'' where the light pulse produces an initial photon interaction with the target material 332'. This light pulse may be of sufficient intensity to produce a substantial EUV emission, (e.g., main pulse) or may constitute a pre-pulse, as described above. In either case, the initial interaction may generate a reflected pulse passing back and forth along beam path 340' between one or more optics in the device 326'' and the target material 332' producing a plurality of subsequent photon interactions with the target material 332'. As described above, the number of subsequent interactions may be controlled by the shutter 328'' to control dose and/or pulse set to pulse set stability.

The operation of the EUV light source shown in FIGS. 2E1 and 2E2 can best be appreciated with cross reference to FIGS. 2F and 2G. As indicated above, the device 326', 326'' may provide an initial light pulse, e.g., laser pulse, produces an initial photon interaction with the target material 332, 332'. This light pulse may be of sufficient intensity to produce a substantial EUV emission, (e.g., main pulse) or may constitute a pre-pulse, as described above. In either case, the initial interaction may generate a reflected pulse passing back and forth along beam path 340, 340' between the optic 336 (FIG. 2E1) or an optic in the device 326'' (FIG. 2E2) and target material 332 and produce a plurality of subsequent photon interactions with the target material 332. This is illustrated in FIG. 2F which shows an EUV output pulse set 342 having a first EUV pulse 342a corresponding to the initial interaction (from a main pulse) and a plurality of EUV pulses 342b,c,d,e,f corresponding to the subsequent photon interactions which result from the reflected pulse traveling back and forth along the beam path 340, 340'. Significant EUV output pulses due to the subsequent photon interactions may, at some point, terminate, as shown, e.g., as losses exceed gain along the beam path 340, 340'. The period between pulses in a pulse set will depend on the length of the beam path 340, 340', and by way of example, a beam path with an optical path length of about 56 meters between target material 332 and optic 336 will result in a period between peaks of about 340 ns. FIG. 2F shows that the pulse set 342 will be followed by another EUV output pulse set 344 having an EUV output pulse 344a initiated when a "new" light pulse from the device 326', 326" interacts with a "new" droplet of target material. As shown, the EUV output pulse set 344 may also include a plurality of EUV pulses 344b,c,d,e,f corresponding to the subsequent photon interactions which result from the reflected pulse traveling back and forth along the beam path 340, 340'. In general, the time period between pulse 342a and 344a is dependent on the pulse repetition rate of the device 326, and may be, for example, about 13.9 uS for a pulse repetition rate of about 72 kHz.

For the EUV pulse sets 342, 344 shown in FIG. 2F and described above, correspond to an operation of the EUV light source shown in FIGS. 2E1, 2E2 in which the shutter 328', 328", remains open. Thus, the number of interactions due to reflections has not been limited by the shutter 328', 328". For comparison, FIG. 2G shows an EUV output pulse set 346 resulting from the operation of the EUV light source shown in FIGS. 2E1, 2E2 in a manner such that the number of interactions due to reflections have been selectively limited by the shutter 328', 328" to control dose and/or pulse set to pulse set stability. In particular, the pulse set 346 having pulses 346a,b,c,d has been limited to three interactions due to reflections (pulses 346b,c,d) and the pulse set 348 having pulses 348a,b,c,d,e has been limited to four interactions due to reflections (pulses 348b,c,d,e).

In more detail, EUV intensities corresponding to one or more of the pulses 346a,b,c,d may be measured by instrument 94a, 94a' and used to generate a signal, e.g. feedback signal which is communicated to controller 60a, 60a'. The controller 60a, 60a' may, in response to the received signal, determine the number of interactions due to reflection required to meet a dose and/or pulse set to pulse set stability specification. For this determination, the controller may, in some cases, use intensity data from previous pulse sets. After processing, the controller 60a, 60a' may then signal the shutter 328', 328" using an appropriate driver to de-energize the shutter 328', 328" at the appropriate time to limit further interactions due to reflection. As described above, the controller 60a, 60a' may use measurements within a pulse set to limit interactions due to reflection in that same pulse set. In one implementation, the controller 60a, 60a' may integrate the intensity generating a pulse energy for each pulse and then accumulate the pulse energy for a given shot until the accumulated pulse energy reaches a pre-selected level. At this point, the controller 60a, 60a' may de-energize the shutter and stop additional generation of the EUV by subsequent reflections.

For the arrangement shown in FIGS. 2E1, 2E2, the shutter 328', 328" and controller 60a, 60a' may be located in the vicinity of the instrument 94a, 94a' to minimize the signal transfer time. Typically, for the case where an instrument measurement within a pulse set is used to limit the next interaction, the EUV light source may be configured such that the system response time (which is equal to the sum of time of signal transfer, data integration and analysis and optical switch delay time) is less than the temporal separation between the reflected pulses, which, as described above, may be about 340 ns. In an alternative implementation, the controller 60a, 60a' may use measurements within a pulse set to limit interactions due to reflection in a different, e.g., subsequent, pulse set. FIG. 3A illustrates a plurality of target material droplets that are traveling along a common path 350, which for the illustration is a substantially linear path. The stream may, for example be created by a droplet dispenser as described above and be falling under the influence of gravity. Droplet paths that are curved may also be used, for example, the droplets may be charged and then deflected, the droplets may follow a curve trajectory under the influence of gravity, etc. FIG. 3A illustrates that some of the droplets on the common path, e.g., droplet 352a may be irradiated by an initial pulse 354, e.g., pre-pulse that is focused to a focal spot at or near the common path 350. FIG. 3A also shows that some droplets, e.g., droplets 352b,c may be allowed to pass through the irradiation zone, and thus, do not participate in the production of plasma and EUV light. Instead, for the arrangement shown in FIG. 3A, only every third droplet is irradiated with the non-participating droplets (so-called buffer droplets) shielding the next participating droplet from the plasma.

FIG. 3B shows the droplets after a short period of time, e.g., 1-100 μs has elapsed after the droplet 352a shown in FIG. 3A is irradiated by an initial pulse, e.g., pre-pulse. As shown, the effect of the initial pulse is to spatially expand the droplet creating an expanded volume 356 that, due to the initial pulse irradiation, has exited the path 350. FIGS. 3A and 3B further show that a subsequent pulse 358, e.g., main pulse, may be delivered to a location 360 that is distanced from the path 350 to expose the expanded volume 356 and produce an EUV output. In particular, as shown, the subsequent pulse 358 may be focused to a focal spot at or near the location 360 such that a substantial intensity is not presented at locations along the linear path 350. With this arrangement, reflections to the device producing the subsequent pulse from the buffer droplets are not created, and as a consequence, the number of reflected photons available to cause self lasing in the device are reduced. For the arrangement shown in FIG. 3B, a substantial intensity is also avoided at locations along the linear path 350 during the delivery of a subsequent pulse, e.g., main pulse. As shown, this may be accomplished by directing the initial pulse and subsequent pulse along different beam-paths.

As illustrated in FIGS. 3A and 3B, the initial pulse 354 and subsequent pulse 358 may be focused to respective focal spots in the droplet 352a and in the expanded volume 356. However, it is to be appreciated that the main pulse focal spot need not necessarily lie within the target volume 356 and the pre-pulse focal spot need not necessarily lie within the droplet 352a. Stated another way, the initial pulse traveling along the beam path shown may be unfocused, or alternatively, may be focused to a focal spot ahead of or behind the droplet 352a. Similarly, the subsequent pulse traveling along the beam path shown may be unfocused, or alternatively, may be focused to a focal spot ahead of or behind the expanded volume 356.

Figure 4:
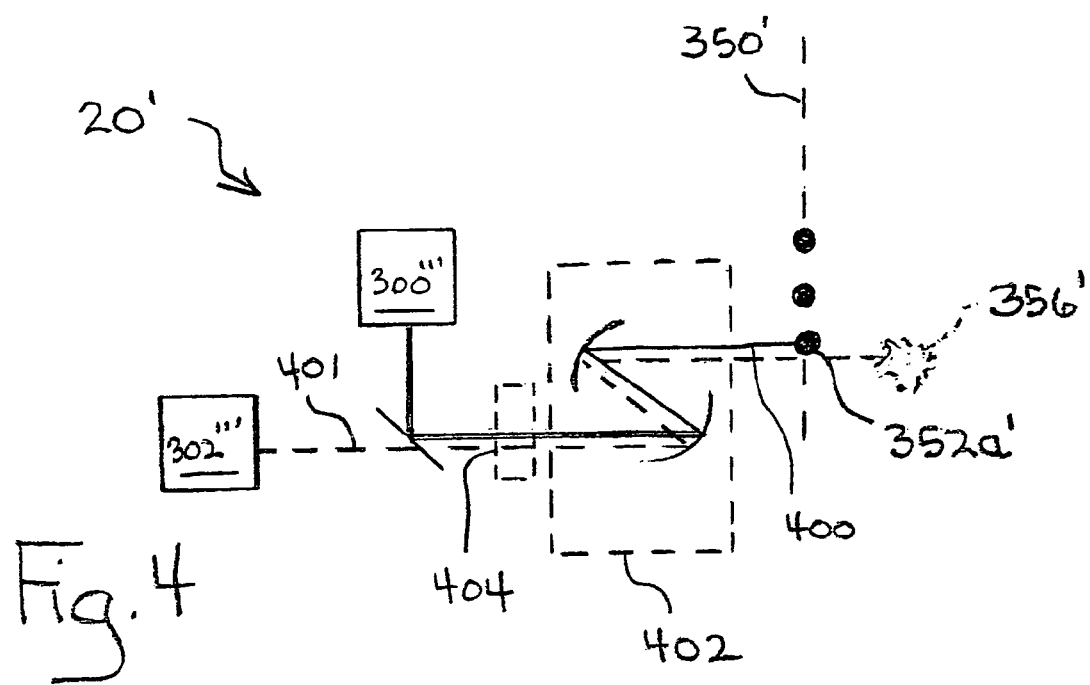
FIG. 4 shows a schematic view of an embodiment in which the pre-pulse and main pulse travel along parallel beam paths and are focused using a common optic to focal spots at different locations.
Figure 4A:
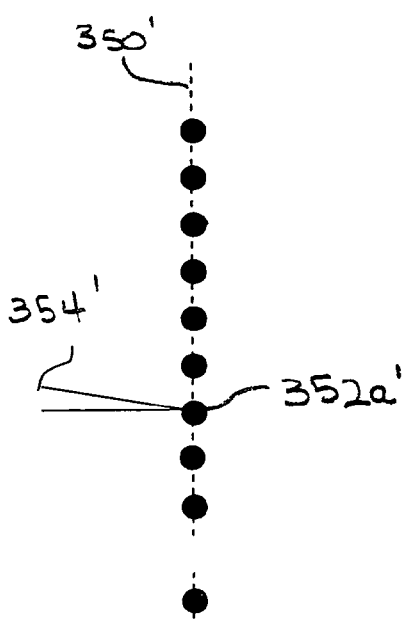
FIG. 4A shows a schematic view illustrating the focusing of a pre-pulse for the arrangement shown in FIG. 4.
Figure 4B:
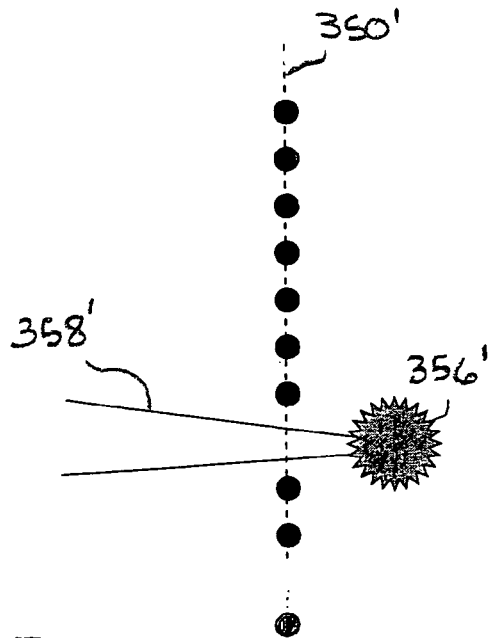
FIG. 4B shows a schematic view illustrating the focusing of a main pulse for the arrangement shown in FIG. 4.

FIG. 4 shows an embodiment in which the initial pulse, e.g., pre-pulse and the subsequent pulse, e.g., main pulse may travel along substantially parallel beam paths 400, 401 and may be focused using a common optic 402. The spacing of the parallel beam paths may compensate for movement of material in the expanding volume. The focusing of an initial pulse relative to the linear path 350' for the arrangement shown in FIG. 4 is illustrated in FIG. 4A and the focusing of a subsequent pulse is shown in FIG. 4B. As described below, for this embodiment, a substantial intensity may be avoided at locations along the linear path 350' during delivery of the subsequent pulse (reducing droplet reflections and/or laser droplet coupling and the associated self-lasing). Stated another way, the subsequent pulse may be in a substantially de-focused condition at locations along the linear path 350' as illustrated in FIG. 4B. As shown, this may be performed while still focusing the initial pulse 354' at or near the droplet 352a' (FIG. 4A) and focusing the subsequent pulse 358' at or near the expanded volume 356' (FIG. 4B). This may be accomplished, for example, by using an initial pulse beam and a subsequent pulse beam that have different beam divergences prior to focusing. This difference in divergence may arise because the initial pulse and subsequent pulse may be initiated by different sources 300''', 302''' and/or one or more optical arrangements may be provided to alter the beam divergence of the initial pulse beam and/or subsequent pulse beam.

As further shown in FIG. 4, the EUV light source 20' may include an optical isolator 404 positioned along the beam path 400 to reduce the number of reflected photons, e.g., photons reflected from droplets, from reaching the light sources 300''' and or 302''' where the photons may cause self lasing and reduce the efficiency of the laser gain media to produce controllable, repeatable pulses. For the light source 20', the optical isolator 404 may include one or more saturable absorbers. For example, a chamber having opposed windows and filled with a saturable absorber material may be provided. The type of saturable absorber material may be selected for the wavelength of interest, e.g., $SF_6$ gas for light at a wavelength of 10.6 μm. Alternatively, or in addition to the saturable absorber(s), the optical isolator 404 may include a switchable shutter or a so-called isolator box (details not shown).

In one construction of an isolator box, the source 302''', e.g., $CO_2$ laser device may employ polarizer(s) and/or Brewster's windows such that light exiting the source 302''' has a primary polarization direction. With this arrangement, the isolator box may include, for example, a phase retarder mirror which rotates back reflected light ninety degrees out of the primary polarization direction and an isolator mirror which absorbs light with the rotated polarization. For example, a suitable unit for use with $CO_2$ lasers may be obtained from Kugler GmbH, Heiligenberger Str. 100, 88682 Salem Germany under the trade name Queller and/or "isolator box". Typically, the isolator box functions to allow light to flow from the source 302''' to the droplet substantially unimpeded while allowing only about one percent of back-reflected light to leak through the isolator box and reach the source 302'''.

It will be understood by those skilled in the art that the aspects of embodiments of the present invention disclosed above are intended to be preferred embodiments only and not to limit the disclosure of the present invention(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the present invention(s) but also such equivalents and other modifications and changes that would be apparent to those skilled in the art. While the particular aspects of embodiment(s) described and illustrated in this patent application in the detail required to satisfy 35 U.S.C. §112 are fully capable of attaining any above-described purposes for, problems to be solved by or any other reasons for or objects of the aspects of an embodiment(s) above described, it is to be understood by those skilled in the art that it is the presently described aspects of the described embodiment(s) of the present invention are merely exemplary, illustrative and representative of the subject matter which is broadly contemplated by the present invention. The scope of the presently described and claimed aspects of embodiments fully encompasses other embodiments which may now be or may become obvious to those skilled in the art based on the teachings of the Specification. The scope of the present invention is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

What is claimed is:

1. An EUV light source comprising:
a plurality of targets;
a system generating laser pulses on an output beam path, the laser pulses for irradiating targets to produce a burst of EUV light pulses;
an instrument measuring an intensity of at least a portion of one EUV light pulse within a burst of EUV light pulses and providing a feedback signal indicative thereof; and
a shutter positioned on the output beam path responsive to the feedback signal to trim a laser pulse, the trimmed laser pulse generating an EUV light pulse during the burst of EUV light pulses.

2. A light source as recited in claim 1 wherein the portion of the EUV pulse measured is selected from the group of portions consisting of a temporal portion, a spatial portion and a temporal and spatial portion.

3. A light source as recited in claim 1 wherein the portion of the EUV pulse measured is a temporal portion and the EUV pulse generating the measured intensity is produced by the trimmed laser pulse.

4. A light source as recited in claim 3 wherein said system comprises an optical oscillator outputting laser pulses with each output laser pulse having a pulse duration, t, and wherein the travel time, T, for light traversing an optical path extending from the optical oscillator output to the target and from the target to an intensity measurement site is less than the pulse duration exiting the oscillator, T<t.

5. A light source as recited in claim 4 wherein the system further comprises at least one optical amplifier receiving laser light from the optical oscillator along an optical path and the shutter is positioned on the optical path between the optical amplifier and the optical oscillator.

6. A light source as recited in claim 1 wherein the EUV pulse measured to produce the feedback signal is generated by a corresponding laser pulse and the feedback signal produced is used to trim a subsequent laser pulse.

7. A light source as recited in claim 1 wherein said shutter comprises an electro-optic switch.

8. A light source as recited in claim 1 wherein said system generating laser pulses comprises an optical oscillator and at least one optical amplifier.

9. A light source as recited in claim 8 wherein the optical oscillator is a cavity dumped oscillator.

10. A light source as recited in claim 8 wherein the optical oscillator is a transverse electrical-discharge oscillator having a pulsed power source.

11. An EUV light source as recited in claim 8 wherein the amplifier comprises a continuously pumped laser device.

12. An EUV light source as recited in claim 1 wherein said system generating laser pulses comprises an optical oscillator defining a primary polarization direction and the shutter comprises an electro-optic switch having an electro-optic cell and a polarizer.

13. An EUV light source as recited in claim 1 further comprising a chamber, the laser pulses irradiating targets in the chamber, and wherein the intensity measuring instrument is positioned outside the chamber.

14. An EUV light source as recited in claim 13 wherein the intensity measuring instrument is positioned in a lithography scanner coupled to the chamber.

15. An EUV light source as recited in claim 13 wherein the intensity measuring instrument is positioned at a location optically downstream of a lithography scanner coupled to the chamber.

16. An EUV light source comprising:
a plurality of targets;
a system generating laser pulses on an output beam path, the laser pulses for irradiating targets to produce EUV light pulses;
a means for measuring an intensity of at least a portion of one EUV light pulse and providing a feedback signal indicative thereof; and
a laser pulse trimming means positioned on the output beam path responsive to the feedback signal to trim a laser pulse.

17. A light source as recited in claim 16 wherein the portion of the EUV pulse measured is selected from the group of portions consisting of a temporal portion, a spatial portion and a temporal and spatial portion.

18. A light source as recited in claim 16 wherein the portion of the EUV pulse measured is a temporal portion and the EUV pulse generating the measured intensity is produced by the trimmed laser pulse.

19. A method of producing EUV light comprising the steps of:
providing a plurality of targets;
generating laser pulseson an output beam path, the laser pulses for irradiating targets to produce EUV light pulses;
measuring an intensity of at least a portion of one EUV light pulse and providing a feedback signal indicative thereof; and
trimming a laser pulse on the output beam path in response to the feedback signal.

20. The method as recited in claim 19 wherein the portion of the EUV pulse measured in said measuring step is a temporal portion and the EUV pulse generating the measured intensity is produced by the trimmed laser pulse.

\* \* \* \* \*